United States Patent
Mangyo

(10) Patent No.: US 11,887,642 B2
(45) Date of Patent: Jan. 30, 2024

(54) STORAGE CONTROL DEVICE, STORAGE DEVICE, AND INFORMATION PROCESSING SYSTEM

(71) Applicant: Sony Semiconductor Solutions Corporation, Kanagawa (JP)

(72) Inventor: Atsuo Mangyo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 432 days.

(21) Appl. No.: 17/290,350

(22) PCT Filed: Sep. 2, 2019

(86) PCT No.: PCT/JP2019/034349
§ 371 (c)(1),
(2) Date: Apr. 30, 2021

(87) PCT Pub. No.: WO2020/095522
PCT Pub. Date: May 14, 2020

(65) Prior Publication Data
US 2022/0005517 A1 Jan. 6, 2022

(30) Foreign Application Priority Data
Nov. 7, 2018 (JP) ................................. 2018-209319

(51) Int. Cl.
*G11C 7/14* (2006.01)
*G11C 11/4099* (2006.01)
*G11C 11/16* (2006.01)

(52) U.S. Cl.
CPC ............ *G11C 11/1675* (2013.01); *G11C 7/14* (2013.01); *G11C 11/161* (2013.01);
(Continued)

(58) Field of Classification Search
CPC ...... G11C 7/14; G11C 11/161; G11C 11/1653; G11C 11/1659; G11C 11/1673; G11C 11/1675; G11C 11/1693; G11C 11/4099
See application file for complete search history.

(56) References Cited

U.S. PATENT DOCUMENTS 9,257,166 B2 * 2/2016 Kim ..................... G11C 5/025
9,349,428 B2 * 5/2016 Antonyan ........... G11C 11/1673
(Continued)

FOREIGN PATENT DOCUMENTS

| JP | 2002-334589 A | 11/2002 |
| JP | 2004-185745 A | 7/2004 |
| WO | WO2018/163737 A1 | 9/2018 |

OTHER PUBLICATIONS

International Search Report issued in International Patent Application No. PCT/JP2019/034349 dated Nov. 19, 2019 and English translation of same. 5 pages.
(Continued)

*Primary Examiner* — Son L Mai
(74) *Attorney, Agent, or Firm* — K&L Gates LLP

(57) ABSTRACT

A state of a reference cell in a storage device is appropriately managed. A first memory cell array includes a first reference cell that generates reference potential of a sense amplifier. A second memory cell array includes a second reference cell that generates reference potential of a sense amplifier. A state storage unit stores, regarding each of the first and second reference cells, a state indicating certainty of a held value. When write to either one of the first and second reference cells is instructed, the write control unit controls the instructed write on the basis of the state regarding the first and second reference cells stored in the state storage unit.

14 Claims, 12 Drawing Sheets

(52) U.S. Cl.
CPC ...... *G11C 11/1673* (2013.01); *G11C 11/1693* (2013.01); *G11C 11/4099* (2013.01); *G11C 11/1653* (2013.01); *G11C 11/1659* (2013.01)

(56) References Cited

U.S. PATENT DOCUMENTS

| | | | |
|---|---|---|---|
| 9,916,883 B2* | 3/2018 | Romanovskyy | .... G11C 11/1673 |
| 10,971,197 B2* | 4/2021 | Tezuka | ................. G11C 13/003 |
| 2002/0159308 A1 | 10/2002 | Fournel et al. | |
| 2004/0109353 A1 | 6/2004 | Matsuoka | |

OTHER PUBLICATIONS

Written Opinion issued in International Patent Application No. PCT/JP2019/034349 dated Nov. 19, 2019. 3 pages.

* cited by examiner

FIG. 10

| CASE | STATE | | | | OPERATION AT TIME OF WRITE TO REFERENCE CELL | |
|---|---|---|---|---|---|---|
| | ARY1 | | ARY2 | | | |
| | REG1 | REG2 | REG1 | REG2 | ARY1 | ARY2 |
| #1 | 0 | 0 | 0 | 0 | EW | EW |
| #2 | 0 | 0 | 0 | 1 | RMW | EW |
| #3 | 0 | 0 | 1 | 1 | RMW | NOP |
| #4 | 0 | 1 | 0 | 0 | EW | RMW |
| #5 | 0 | 1 | 0 | 1 | RMW | RMW |
| #6 | 0 | 1 | 1 | 1 | RMW | NOP |
| #7 | 1 | 1 | 0 | 0 | NOP | RMW |
| #8 | 1 | 1 | 0 | 1 | NOP | RMW |
| #9 | 1 | 1 | 1 | 1 | NOP | NOP |

STORAGE CONTROL DEVICE, STORAGE DEVICE, AND INFORMATION PROCESSING SYSTEM

TECHNICAL FIELD

The present technology relates to a storage device. More specifically, this relates to a storage device provided with a reference cell, a storage control device thereof, and an information processing system.

BACKGROUND ART

One that determines a storage state of a memory cell using a reference cell that holds a reference threshold when performing read from the memory cell in a storage device is known. For example, in a storage device using a magnetic tunnel junction (MTJ) element, values of a plurality of reference cells are supplied to one input of a sense amplifier by generating intermediate potential of generated potential corresponding to logic levels "0" and "1" by a reference potential generation circuit. Here, this MTJ element has a characteristic of stochastically exceeding the threshold due to thermal fluctuation due to ambient temperature, and this is known as retention. Furthermore, an insulating layer forming the MTJ element has a thin film thickness, and there is a failure mode of dielectric breakdown, which is known as endurance. In a case where a data value of the reference cell is not as expected due to an influence of such retention and endurance, an incorrect value might be output from the sense amplifier. Therefore, for example, a semiconductor device is proposed that counts the number of times the reference cell is accessed and checks whether or not the state of the reference cell falls within a predetermined distribution range when this reaches the specified number of times (for example, refer to Patent Document 1).

CITATION LIST

Patent Document

Patent Document 1: Japanese Patent Application Laid-Open No. 2004-185745

SUMMARY OF THE INVENTION

Problems to be Solved by the Invention

In the above-described conventional technology, when the number of times the reference cell is accessed reaches the specified number of times, if the state of the reference cell does not fall within a predetermined distribution range, the value is corrected. However, in this case, since only the number of times of access is used as a reference, it is not possible to deal with a time-dependent data holding characteristic such as retention. Therefore, there is possibility that the state of the reference cell cannot be appropriately managed.

The present technology has been achieved in view of such a situation, and an object thereof is to appropriately manage the state of the reference cell in the storage device.

Solutions to Problems

The present technology is achieved for solving the above-described problem, and a first aspect thereof is a storage control device, a storage device, and an information processing system provided with a state storage unit that stores, regarding each of a first reference cell that generates reference potential of a sense amplifier, the first reference cell included in a first memory cell array, and a second reference cell that generates reference potential of the sense amplifier, the second reference cell included in a second memory cell array, a state indicating certainty of a held value, and a write control unit that controls, when write to either one of the first and second reference cells is instructed, the instructed write on the basis of the state regarding the first and second reference cells stored in the state storage unit. This brings an effect of controlling the write to the first and second reference cells on the basis of the state indicating certainty of the values held in the first and second reference cells.

Furthermore, in the first aspect, the write control unit may perform write to first and second reference cell groups including the first and second reference cells, respectively, as a unit, and the state storage unit may store the state for each of the first and second reference cell groups. This brings an effect of controlling the write for each of the first and second reference cell groups.

Furthermore, in the first aspect, when the write to either one of the first and second reference cells is performed, the state storage unit may update the state regarding the reference cell to which the write is performed. This brings an effect of updating the state according to the write to the first and second reference cells.

Furthermore, in the first aspect, when the write to either one of the first and second reference cells is performed, the state storage unit may update the state regarding the reference cell according to an elapsed time from the write. This brings an effect of updating the state according to the elapsed time from the write to the first and second reference cells.

Furthermore, in the first aspect, a timer circuit that manages the elapsed time from the write may be further provided. This brings an effect of updating the state triggered by notice from the timer circuit.

Furthermore, in the first aspect, in a case where the state regarding the first reference cell stored in the state storage unit satisfies a predetermined condition when the write to the first reference cell is instructed, the write control unit may control not to perform the write to the first reference cell. This brings an effect of controlling not to perform unnecessary write.

Furthermore, in the first aspect, in a case where the state regarding the first reference cell stored in the state storage unit does not satisfy the predetermined condition when the write to the first reference cell is instructed, the write control unit may control to perform the write to the first reference cell according to the state regarding the second reference cell stored in the state storage unit. This brings an effect of controlling the write to the first reference cell according to the state of the second reference cell.

Furthermore, in the first aspect, in a case where the state regarding the first reference cell does not satisfy the predetermined condition and in a case where the state regarding the second reference cell satisfies another predetermined condition, the write control unit may control to perform the write to the first reference cell only when a value of the first reference cell read with reference to the reference potential generated from the second reference cell does not coincide with a predetermined read expected value. This brings an effect of performing the write to the first reference cell only in a case where the value of the first reference cell does not coincide with the read expected value.

Furthermore, in the first aspect, a decision circuit that decides whether the value of the first reference cell read with reference to the reference potential of the sense amplifier generated from the second reference cell coincides with the predetermined read expected value may be further provided. This brings an effect of performing coincidence decision between the value of the first reference cell and the read expected value.

Furthermore, in the first aspect, in a case where the state regarding the first reference cell does not satisfy the predetermined condition and in a case where the state regarding the second reference cell does not satisfy another predetermined condition, the write control unit may control to perform the write to the first reference cell. This brings an effect of controlling the write to the first reference cell according to the state of the second reference cell.

Furthermore, in the first aspect, as the first and second reference cells, for example, a resistance change memory element is assumed, and especially, a magnetic resistance change memory element is assumed.

BRIEF DESCRIPTION OF DRAWINGS

FIG. 10 is a view illustrating a truth value table of an operation example of the reference cell write operation control circuit 191 in the embodiment of the present technology.

MODE FOR CARRYING OUT THE INVENTION

A Mode for carrying out the present technology (hereinafter, referred to as an embodiment) is hereinafter described. The description is given in the following order.
1. Circuit Configuration
2. Write Control
3. Application Example 1. Circuit Configuration

Figure 1:
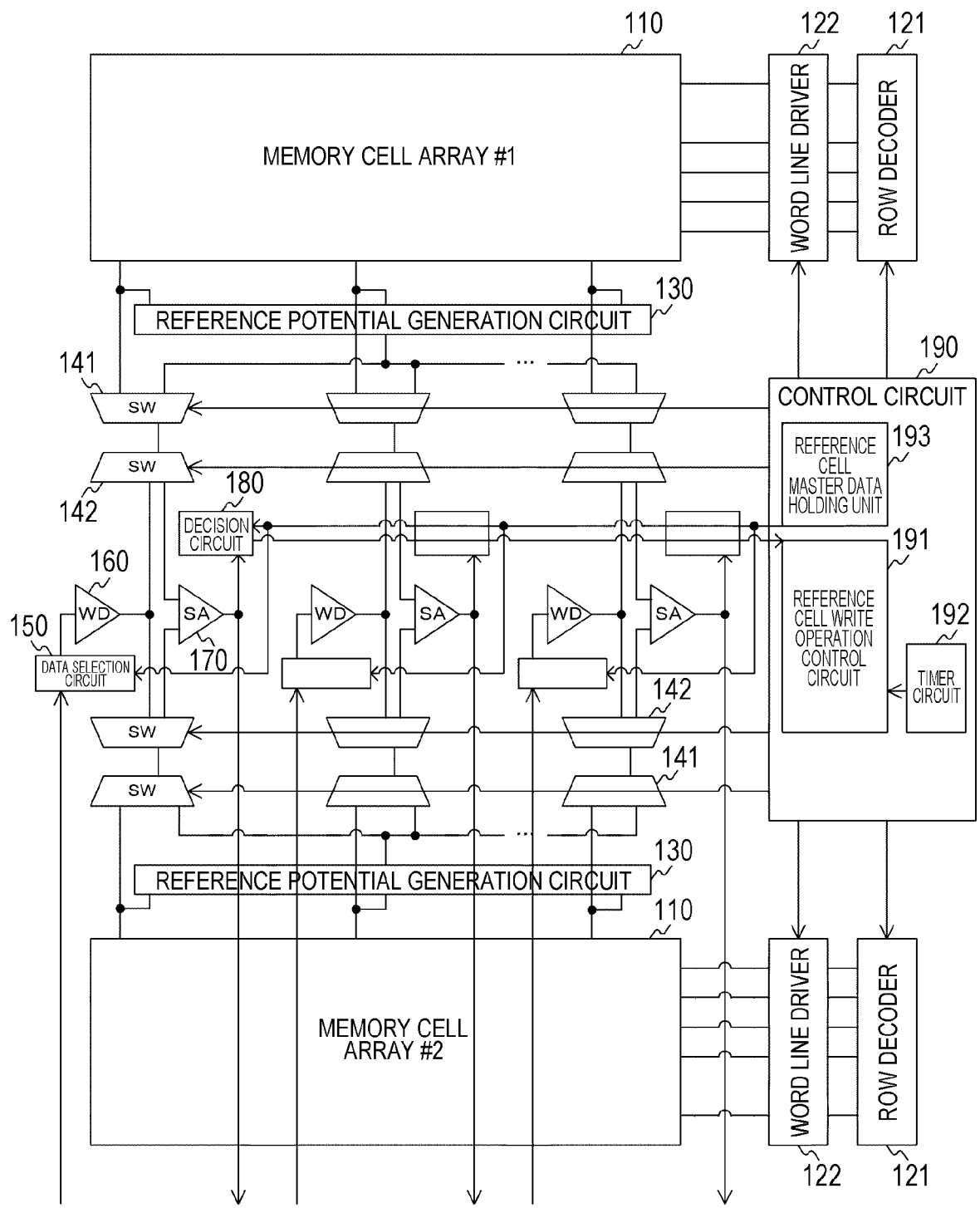
FIG. 1 is a view illustrating a circuit configuration example of a storage device in an embodiment of the present technology.

[Storage Device]
FIG. 1 is a view illustrating a circuit configuration example of a storage device in an embodiment of the present technology.

This storage device includes two memory cell arrays (#1 and #2) 110, each of which is provided with a row decoder 121, a word line driver 122, a reference potential generation circuit 130, and switches 141 and 142. Furthermore, this storage device is provided with a data selection circuit 150, a write driver 160, a sense amplifier 170, and a decision circuit 180 corresponding to each column. Furthermore, this storage device is provided with a control circuit 190 including a reference cell write operation control circuit 191, a timer circuit 192, and a reference cell master data holding unit 193.

The memory cell array 110 is obtained by arranging memory cells in a two-dimensional matrix (array).

The row decoder 121 decodes an address to the memory cell array 110 to generate a row address in the memory cell array 110. The word line driver 122 is a driver that drives a word line (row) specified by the row decoder 121.

The reference potential generation circuit 130 is a circuit that generates reference potential on the basis of a value of a reference cell connected to a reference word line output from the memory cell array 110.

The switch 141 is a bidirectional switch for switching connection between corresponding memory cell array 110 and switch 142. This switch 141 selects either one of a data value output from the corresponding memory cell array 110 and a data value of the reference potential generated by a corresponding reference potential generation circuit 130 and outputs the same to the corresponding switch 142. Furthermore, the switch 141 supplies a data value output from the switch 142 to the corresponding memory cell array 110. Switch control of the switch 141 is performed on the basis of an instruction from the control circuit 190.

The switch 142 is a bidirectional switch for switching connection between the corresponding switch 141 and corresponding write driver 160 and sense amplifier 170. This switch 142 selects a data value supplied from the corresponding write driver 160 and supplies the same to the corresponding switch 141. Furthermore, the switch 142 selects a data value output from the corresponding switch 141 and supplies the same to one input of the corresponding sense amplifier 170. Switch control of the switch 142 is performed on the basis of the instruction from the control circuit 190.

The data selection circuit 150 selects either one of a data value supplied from outside and a data value of the reference cell master data holding unit 193 and supplies the same to the corresponding write driver 160.

The write driver (WD) 160 is a driver that drives the data value supplied from the data selection circuit 150 for writing to the memory cell array 110.

The sense amplifier (SA) 170 is a sense amplifier that amplifies the data value output from the memory cell array 110 to output. The sense amplifier 170 is provided with two input terminals, to one of which potential to be sensed output from the memory cell array 110 is input, and to the other of which the reference potential generated by the reference potential generation circuit 130 is input. Therefore, the sense amplifier 170 amplifies the potential to be sensed with reference to the reference potential and outputs read data.

The read data output from the sense amplifier 170 is supplied to the outside and input to the decision circuit 180.

The decision circuit 180 compares the output of the sense amplifier 170 with the data value of the reference cell master data holding unit 193 to decide whether or not they coincide with each other in order to verify the data value of the reference cell of the memory cell array 110. A decision result by the decision circuit 180 is supplied to the reference cell write operation control circuit 191.

The reference cell write operation control circuit 191 is a circuit that controls a write operation to the reference cell of the memory cell array 110. As described later, the reference cell write operation control circuit 191 stores, regarding the reference cell of the memory cell array 110, a state indicating certainty of a held value and controls the write operation to the reference cell on the basis of the state.

The timer circuit 192 is a timer that manages an elapsed time from write to the reference cell of the memory cell array 110. When a predetermined elapsed time is detected by the timer circuit 192, the reference cell write operation control circuit 191 is notified of this.

The reference cell master data holding unit 193 holds a value serving as a master of the reference cell of the memory cell array 110. That is, reference cell master data held in the reference cell master data holding unit 193 is read expected value for verifying the data value of the reference cell of the memory cell array 110 in the decision circuit 180. Furthermore, the reference cell master data serves as a data value when performing rewrite in a case where the reference cell of the memory cell array 110 is not appropriate. It is sufficient that the reference cell master data holding unit 193 holds fixed values at high and low levels, and may be formed by using a flip-flop, a fixed resistance and the like.

[Memory Cell Array]

Figure 2:
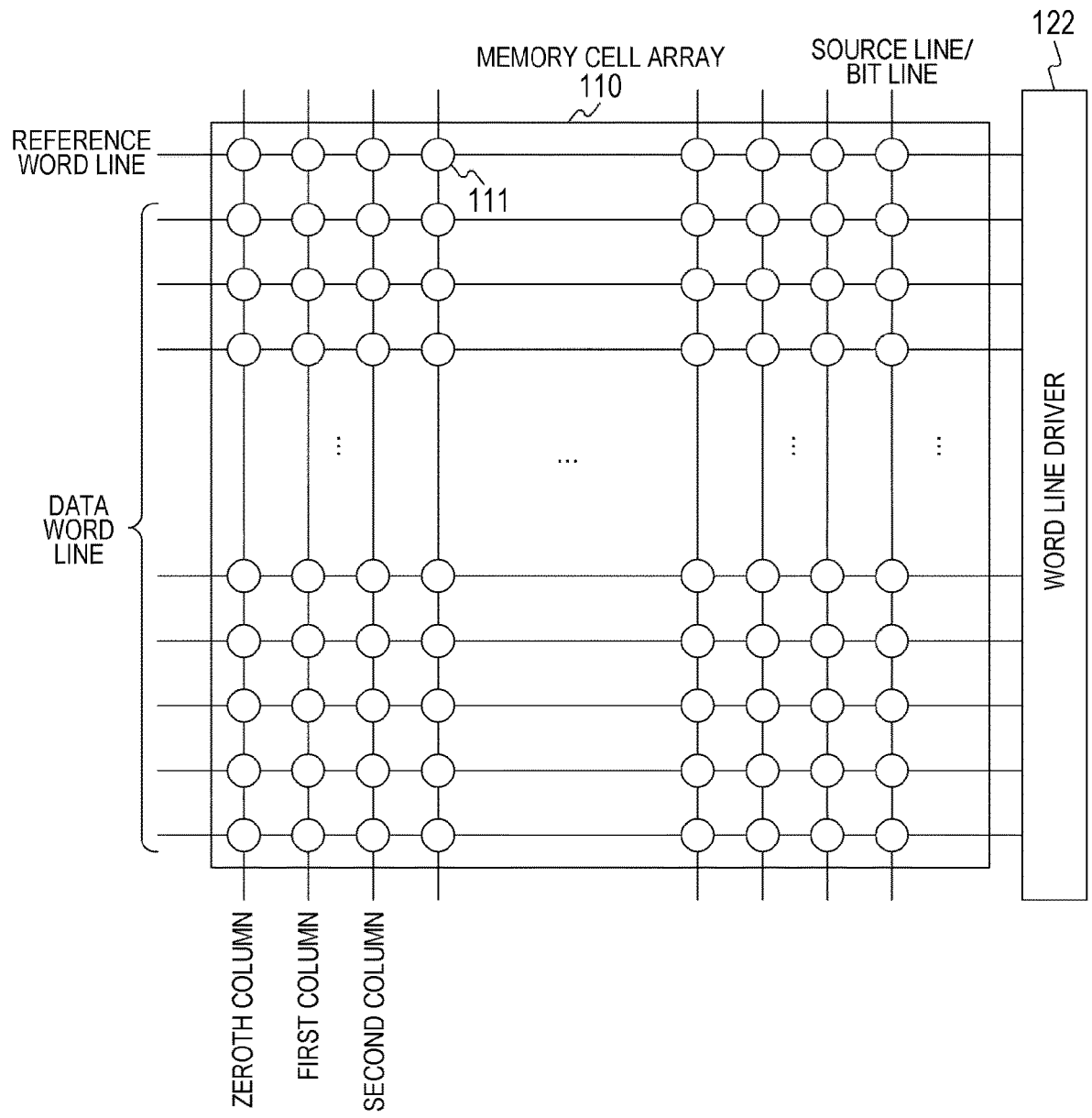
FIG. 2 is a view illustrating a configuration example of a memory cell array 110 in the embodiment of the present technology.

FIG. 2 is a view illustrating a configuration example of the memory cell array 110 in the embodiment of the present technology.

The memory cell array 110 is obtained by arranging memory cells 111 in a two-dimensional matrix. The memory cells 111 in the memory cell array 110 are driven by the word line driver 122 for each word line in a row direction as a unit. Furthermore, a source line and a bit line are formed in a column direction to be connected in series to the respective memory cells 111.

The word lines of the memory cell array 110 include a data word line used as a normal data storage area and the reference word line used as the reference cells. As described above, the reference cell is used for generating the reference potential at the time of data read.

Note that, in this example, the reference word line is illustrated in the highest row of the memory cell array 110, but this may be arranged in any row. For example, it is desirable to arrange the reference word line in the center row of the memory cell array 110 from the viewpoint of parasitic resistance.

Figure 3:
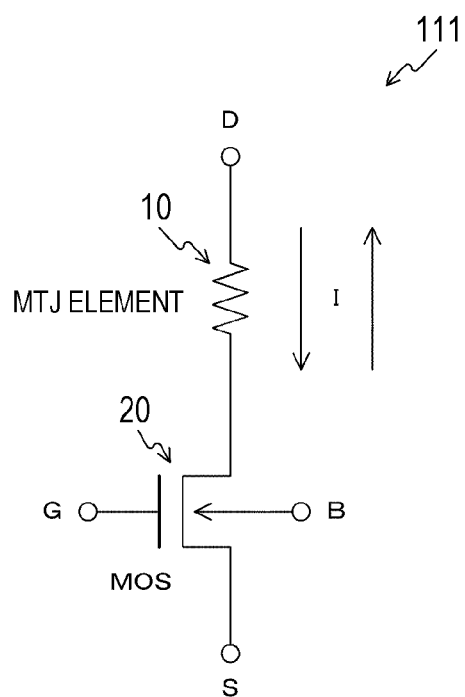
FIG. 3 is a view illustrating a configuration example of a memory cell 111 in the embodiment of the present technology.

FIG. 3 is a view illustrating a configuration example of the memory cell 111 in the embodiment of the present technology.

Here, a spin transfer torque random access memory (STT-MRAM) is described as an example. This STT-MRAM is a memory that uses a tunnel magnetoresistance element (MTJ element) being a type of a resistance change element as a memory cell, and stores logic levels "0" and "1" by utilizing the fact that a resistance value changes due to a tunnel magnetoresistance effect (TMR effect).

The memory cell 111 has a one-transistor one-resistance configuration in which an MTJ element 10 and an MOS transistor 20 are serially connected. The MOS transistor 20 may be either a negative-channel metal oxide semiconductor (NMOS) or a positive-channel metal oxide semiconductor (PMOS).

Figure 4:
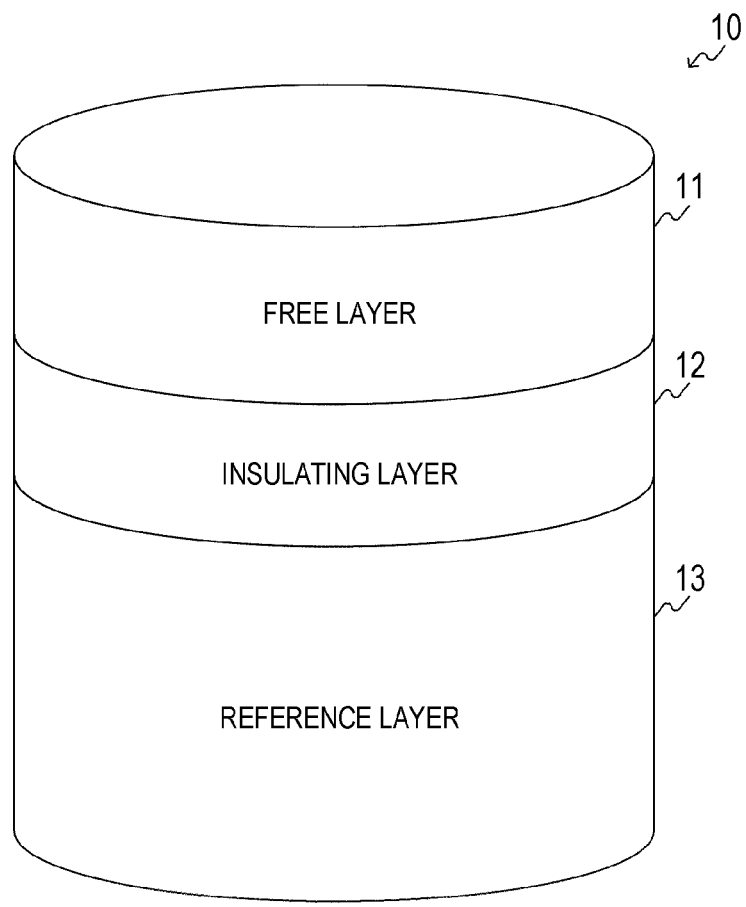
FIG. 4 is a view illustrating a structure example of an MTJ element 10 in the embodiment of the present technology.

FIG. 4 is a view illustrating a structure example of the MTJ element 10 in the embodiment of the present technology.

The MTJ element 10 has a configuration in which two magnetic layers are joined to upper and lower sides of an insulating layer 12, one of which is referred to as a free layer 11 and the other of which is referred to as a reference layer 13. When magnetization directions of the free layer 11 and reference layer 13 are the same, this is put into a low-resistance state and is associated with the logic level "0" of stored data, for example. Furthermore, when the magnetization directions of the free layer 11 and reference layer 13 are opposite to each other, this is put into a high-resistance state and is associated with the logic level "1" of the stored data, for example.

The stored data of the MTJ element 10 is inverted by application of a current to the MTJ element 10. That is, either one of the logic levels "0" and "1" is stored by deciding the magnetization direction of the free layer 11 depending on whether a current I is applied in a direction from a drain terminal D to a source terminal S or the current I is applied in a direction from the source terminal S to the drain terminal D.

[Operation]

Figure 5:
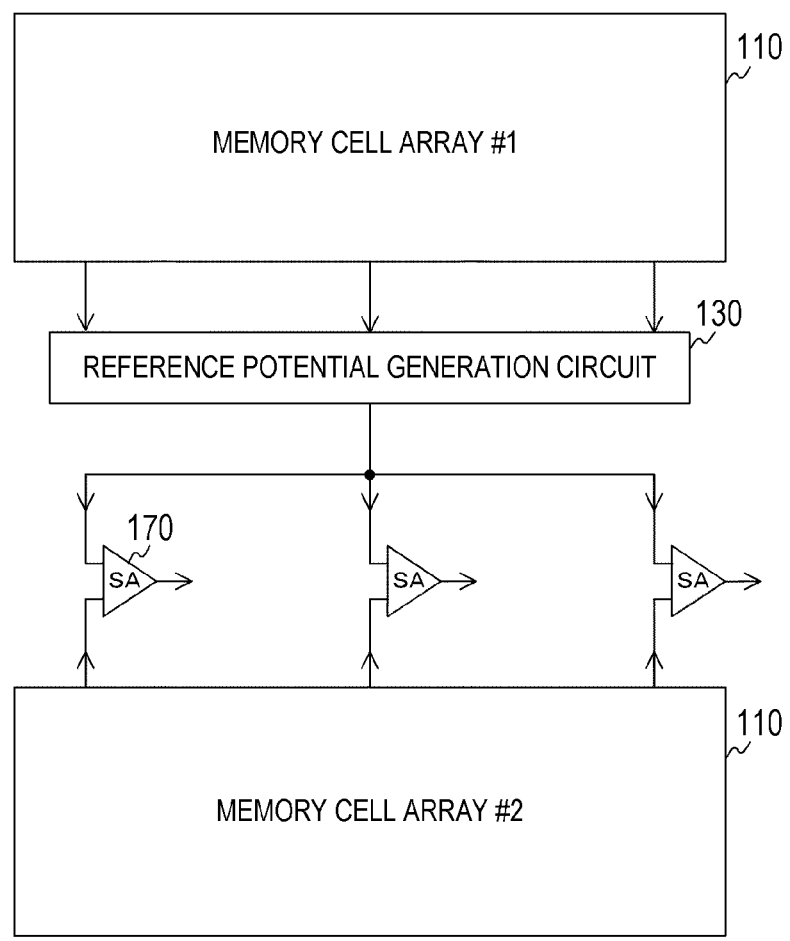
FIG. 5 is a view illustrating an example of a flow of data in a read operation in the embodiment of the present technology.

FIG. 5 is a view illustrating an example of a flow of data in a read operation in the embodiment of the present technology.

In this example, a case of reading data of the memory cell array #2 with reference to the reference cell of the memory cell array #1 is described. Note that, in a case of reading data of the memory cell array #1 with reference to the reference cell of the memory cell array #2, basic operation is similar except that a relationship between both of them is reversed.

The value of the reference cell of the reference word line of the memory cell array #1 is input to the reference potential generation circuit 130. The reference potential generation circuit 130 generates the reference potential on the basis of the value of the reference cell output from the memory cell array #1. The generated reference potential is supplied to one input terminal of the sense amplifier 170 via the switches 141 and 142.

A data value of the data word line of the memory cell array #2 is supplied to the other input terminal of the sense amplifier 170 via the switches 141 and 142.

The sense amplifier 170 amplifies, with reference to the reference potential supplied to one input terminal, the data value supplied to the other input terminal and outputs the read data.

Figure 6:
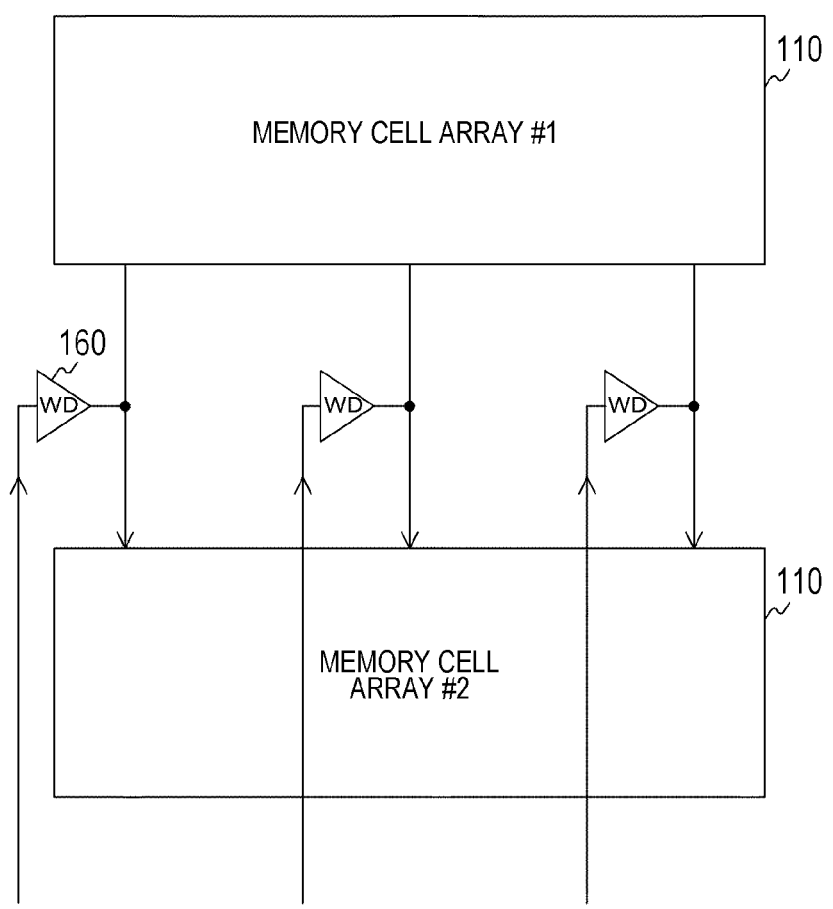
FIG. 6 is a view illustrating an example of a flow of data in a write operation in the embodiment of the present technology.

FIG. 6 is a view illustrating an example of a flow of data in a write operation in the embodiment of the present technology.

In this example, a case of writing the data to the memory cell array #2 is described. Write data supplied from outside is selected by the data selection circuit 150 and driven by the write driver 160. An output of the write driver 160 is supplied to the memory cell array #2 via the switches 142 and 141 and write is performed.

Note that, in a case of writing the data to the memory cell array #1, the output of the write driver 160 is supplied to the memory cell array #1 by switching the switches 142 and 141.

Figure 7:
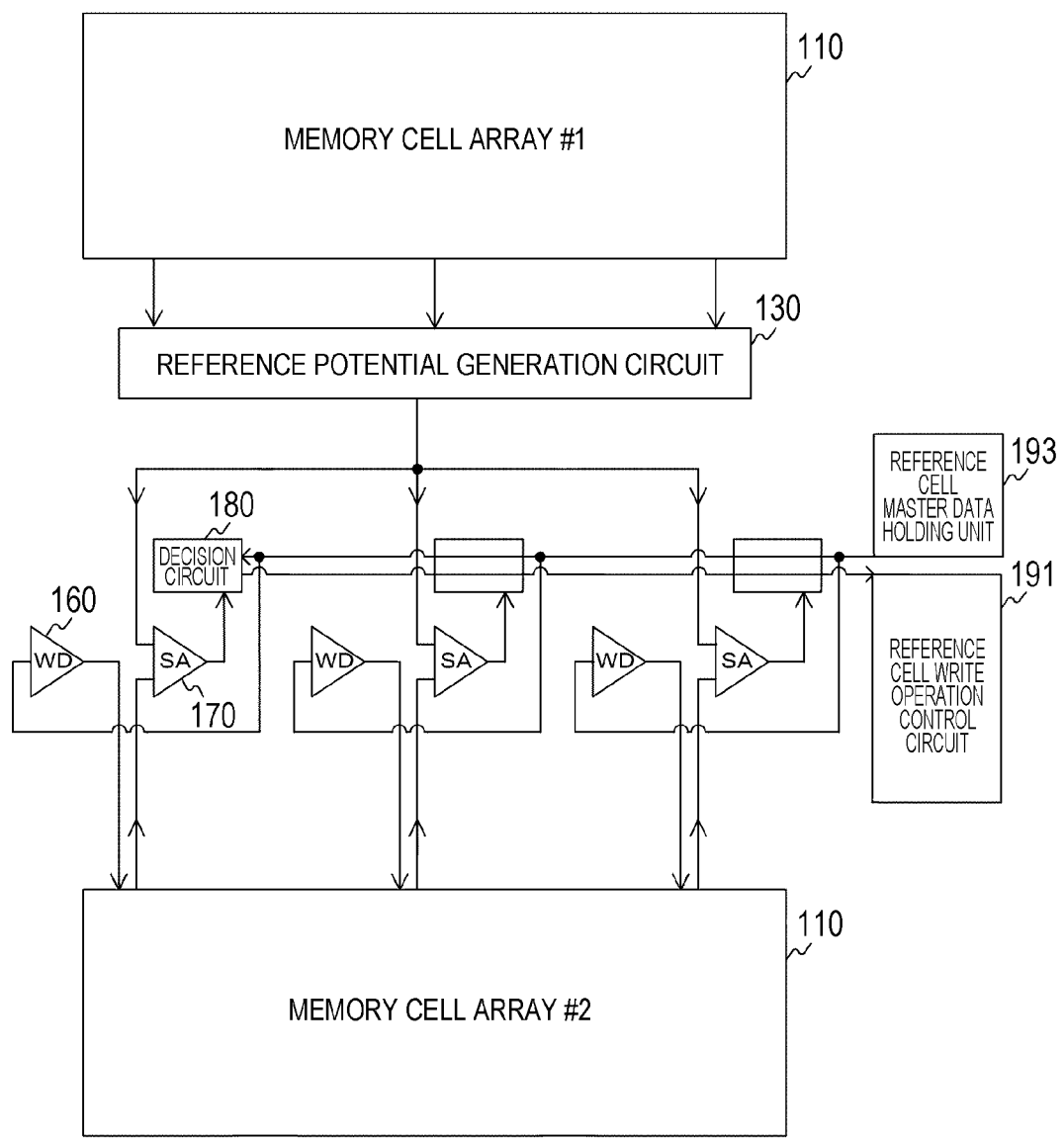
FIG. 7 is a view illustrating an example of a flow of data in a read modify write operation in the embodiment of the present technology.

FIG. 7 is a view illustrating an example of a flow of data in a read modify write operation in the embodiment of the present technology.

As described later, in this embodiment, read is performed in order to verify the data value of the reference cell, and write is performed in a case where the output of the sense amplifier 170 does not coincide with the read expected value. This operation is referred to as read modify write (RMW). In this example, the reference cell of the memory cell array #2 is verified on the assumption that the data of the reference cell of the memory cell array #1 is certain. That is, the data value of the reference cell of the memory cell array #2 is read with reference to the reference cell of the memory cell array #1 as in the above-described normal read. The output of the sense amplifier 170 at that time is supplied to a corresponding decision circuit 180. Furthermore, the reference cell master data held in the reference cell master data holding unit 193 is supplied to the decision circuit 180. The decision circuit 180 reports a decision result to the reference cell write operation control circuit 191.

As a result of the decision by the decision circuit 180, when the output of the sense amplifier 170 coincides with the reference cell master data, the reference cell write operation control circuit 191 controls not to perform write to the reference cell of the memory cell array #2.

On the other hand, in a case where the output of the sense amplifier 170 does not coincide with the reference cell master data, the reference cell write operation control circuit 191 supplies the reference cell master data to the write driver 160 via the data selection circuit 150. Then, the reference cell write operation control circuit 191 controls to write the reference cell master data to the reference cell of the memory cell array #2 via the switches 142 and 141.

2. Write Control

[Reference Cell Write Operation Control Circuit]

Figure 8:
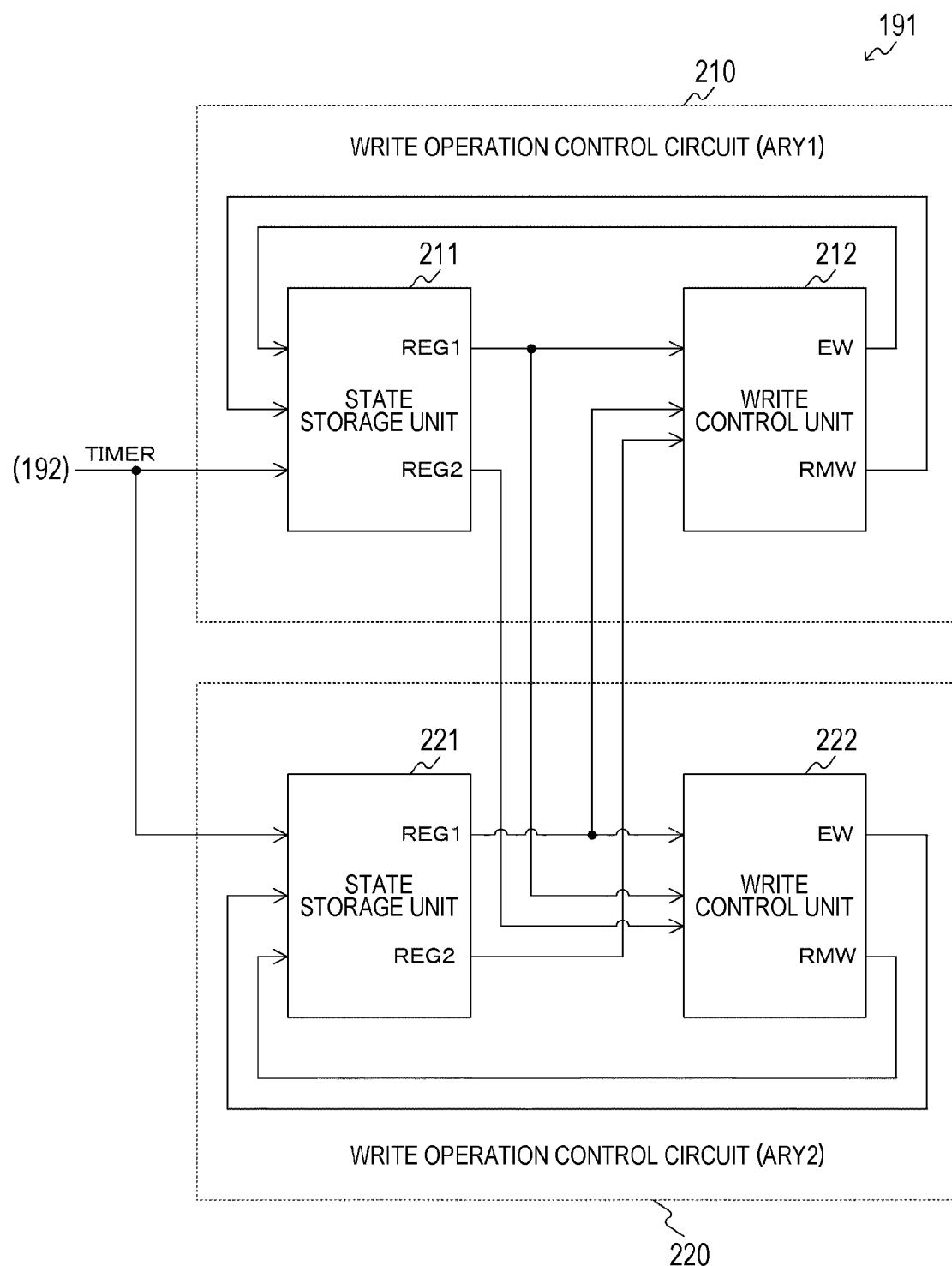
FIG. 8 is a view illustrating a circuit configuration example of a reference cell write operation control circuit 191 in the embodiment of the present technology.

FIG. 8 is a view illustrating a circuit configuration example of the reference cell write operation control circuit 191 in the embodiment of the present technology.

The reference cell write operation control circuit 191 is provided with a write operation control circuit #1 (210) that manages a state of the reference cell of the memory cell array #1 and a write operation control circuit #2 (220) that manages a state of the reference cell of the memory cell array #2. The write operation control circuit #1 is provided with a state storage unit 211 and a write control unit 212, and the write operation control circuit #2 is provided with a state storage unit 221 and a write control unit 222.

The state storage unit 211 stores the state indicating the certainty of the value held in the reference cell of the memory cell array #1. The state storage unit 221 stores the state indicating the certainty of the value held in the reference cell of the memory cell array #2. An output TIMER of the timer circuit 192 is input to the state storage units 211 and 221. Furthermore, outputs of the write control units 212 and 222 are input to the state storage units 211 and 221, respectively. Each of the state storage units 211 and 221 outputs values of REG1 and REG2.

Assuming a 2-bit value obtained by arranging the values of REG1 and REG2 in this order, "00" means that the data value held in the corresponding reference cell is uncertain. Furthermore, "11" means that it is in a retention time from write to the corresponding reference cell. "01" means an intermediate state.

The write control unit 212 controls the write operation to the reference cell of the memory cell array #1. The write control unit 222 controls the write operation to the reference cell of the memory cell array #2. REG1 of the state storage unit 211 and REG1 and REG2 of the state storage unit 221 are input to the write control unit 212. REG1 of the state storage unit 221 and REG1 and REG2 of the state storage unit 211 are input to the write control unit 222. Each of the write control units 212 and 222 outputs values of EW and RWM.

EW indicates whether or not to perform enforce write to the reference cell of the corresponding memory cell array. For example, when EW is "1", the enforce write is performed, and when EW is "0", the enforce write is not performed.

RWM indicates whether or not to perform read modify write to the reference cell of the corresponding memory cell array. For example, when RWM is "1", the read modify write is performed, and when RWM is "0", the read modify write is not performed.

A write timing to the reference cell may be an arbitrary timing. Furthermore, in order to suppress an influence on a system performance, it is possible to perform write to the reference cell of the array different from the accessed data cell at the time of write operation to the data cell. Furthermore, depending on an array dividing method, it is possible to perform write to the reference cell of the array not accessed at the time of read operation of the data cell.

[Procedure]

Figure 9:
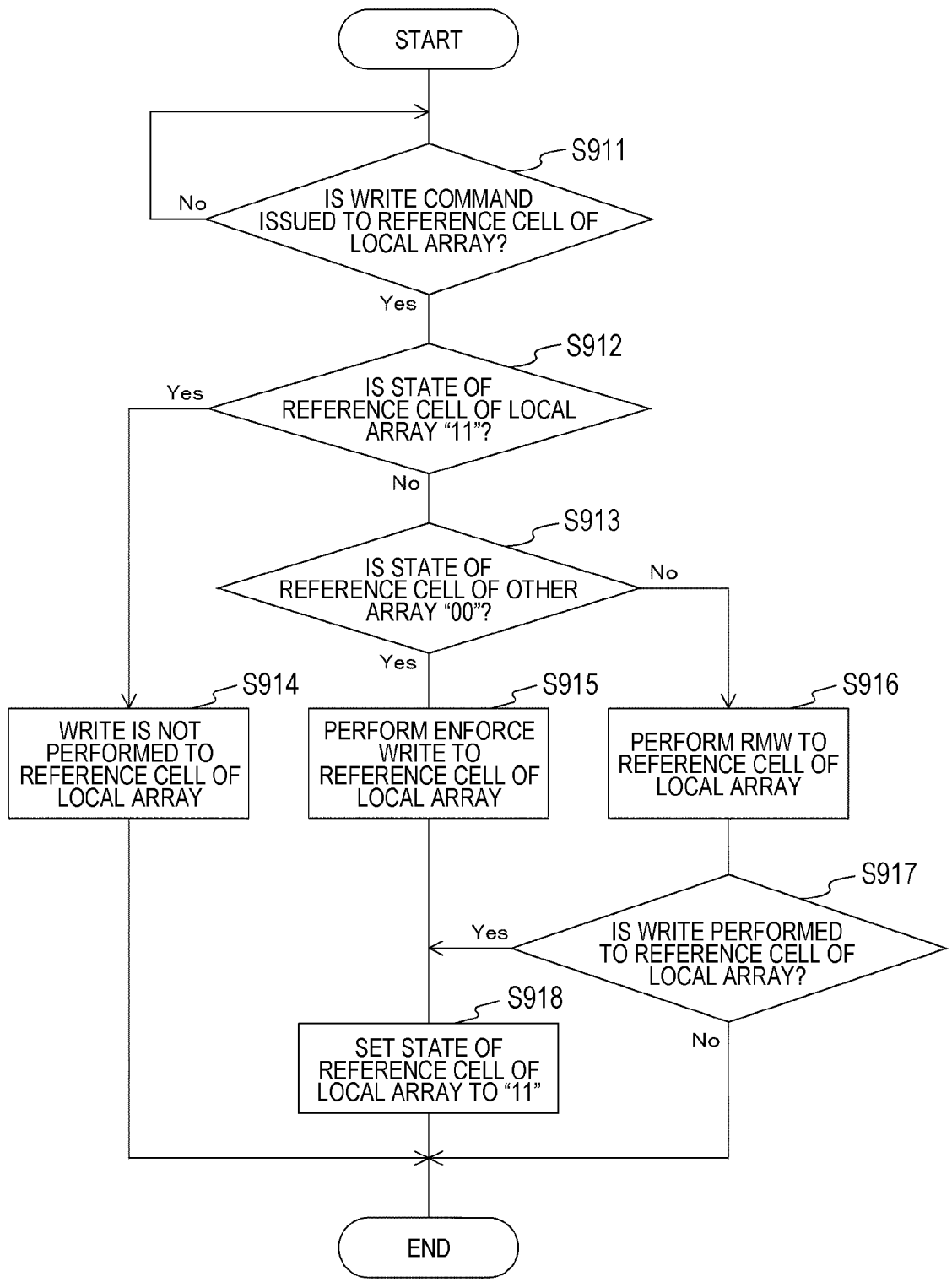
FIG. 9 is a view illustrating a procedure example of the reference cell write operation control circuit 191 in the embodiment of the present technology.

FIG. 9 is a view illustrating a procedure example of the reference cell write operation control circuit 191 in the embodiment of the present technology.

Here, when a write command is issued to one reference cell of the memory cell array 110, the memory cell array is referred to as a local array, and the other memory cell array is referred to as the other array. Note that the write command to the reference cell may be an explicit command from a host computer, or may be an internal command generated in the storage device in response to a data write command from the host computer. That is, it is also possible to perform write to the reference cell by taking advantage of write to the data cell. Furthermore, an internal timer may be used to perform maintenance (refresh) of the data value at a regular timing irrespective of the host computer. Furthermore, in a case of issuing the explicit command from the host computer, for example, this may be issued as a part of an initial sequence when the power is turned on.

When the write command to the reference cell of the local array is issued (step S911: Yes), the write control is performed by the following determination. If REG1 and REG2 of the state storage unit corresponding to the local array are "11" (step S912: Yes), it is in the retention time of the reference cell, so that the write is not performed to the reference cell of the local array (NOP) (step S914).

If REG1 and REG2 of the state storage unit corresponding to the local array are not "11" (step S912: No), the write control is performed according to REG1 and REG2 of the state storage unit corresponding to the other. If REG1 and REG2 of the state storage unit corresponding to the other array are "00" (step S913: Yes), the data value of the reference cell of the other array is uncertain and not suitable for application of generating the reference potential, so that the enforced write (EW) is performed to the reference cell of the local array without verification (step S915). Then, REG1 and REG2 of the state storage unit corresponding to the local array are set to "11" (step S918).

On the other hand, if REG1 and REG2 of the state storage unit corresponding to the other array are not "00" (step S913: No), the reference potential is generated using the reference cell of the other array, and the reference cell of the local array is read to perform the read modify write (RMW) operation (step S916). That is, if the read value coincides with the read expected value, it is controlled not to perform the write to the reference cell of the local array. On the other hand, if this does not coincide with the read expected value, it is controlled to perform the write to the reference cell of the local array. At that time, in a case where the write is performed to the reference cell of the local array (step S917: Yes), REG1 and REG2 of the state storage unit corresponding to the local array are set to "11" (step S918).

[Truth Value Table]

FIG. 10 is a view illustrating a truth value table of an operation example of the reference cell write operation control circuit 191 in the embodiment of the present technology.

In this example, an operation at the time of reference cell write for a combination of REG1 and REG2 of the state storage unit 211 corresponding to the memory cell array #1 (ARY1) and REG1 and REG2 of the state storage unit 221 corresponding to the memory cell array #2 (ARY2) is illustrated.

In a case #1, REG1 and REG2 of both of them are "00", and this means that the data values in the reference cells of both the memory cell arrays #1 and #2 are uncertain. At that time, when the write command is issued to the reference cell of the memory cell array #1, the enforced write (EW) operation of the expected value to the reference cell of the memory cell array #1 is performed without necessity of checking the certainty of the data in the reference cell of the memory cell array #2. The same applies to a case where the write command is issued to the reference cell of the memory cell array #2, and the enforced write (EW) operation of the expected value to the reference cell of the memory cell array #2 is performed.

In a case #2, REG1 and REG2 of the memory cell array #2 are "01" as compared with the case #1. Therefore, in a case where the write command is issued to the reference cell of the memory cell array #1, the reference cell of the memory cell array #2 is used to generate the reference potential, and the reference cell of the memory cell array #1 is read to perform the read modify write (RMW) operation. On the other hand, in a case where the write command is issued to the reference cell of the memory cell array #2, the enforced write (EW) operation of the expected value is performed as in the case #1.

In a case #3, REG1 and REG2 of the memory cell array #2 are "11" as compared with the case #2. Therefore, in a case where the write command is issued to the reference cell of the memory cell array #2, it is controlled not to perform the write to the reference cell of the memory cell array #2 (NOP). On the other hand, in a case where the write command is issued to the reference cell of the memory cell array #1, the read modify write (RMW) operation is performed as in the case #2.

In a case #4, REG1 and REG2 of the memory cell array #1 are "01" as compared with the case #1. Therefore, in a case where the write command is issued to the reference cell of the memory cell array #2, the reference cell of the memory cell array #1 is used to generate the reference potential, and the reference cell of the memory cell array #2 is read to perform the read modify write (RMW) operation. On the other hand, in a case where the write command is issued to the reference cell of the memory cell array #1, the enforced write (EW) operation of the expected value is performed as in the case #1.

In a case #5, REG1 and REG2 of the memory cell array #2 are "01" as compared with the case #4. Therefore, in a case where the write command is issued to the reference cell of the memory cell array #1, the reference cell of the memory cell array #2 is used to generate the reference potential, and the reference cell of the memory cell array #1 is read to perform the read modify write (RMW) operation. On the other hand, in a case where the write command is issued to the reference cell of the memory cell array #2, the read modify write (RMW) operation is performed as in the case #4.

In a case #6, REG1 and REG2 of the memory cell array #2 are "11" as compared with the case #5. Therefore, in a case where the write command is issued to the reference cell of the memory cell array #2, it is controlled not to perform the write to the reference cell of the memory cell array #2 (NOP). On the other hand, in a case where the write command is issued to the reference cell of the memory cell array #1, the read modify write (RMW) operation is performed as in the case #5.

In a case #7, REG1 and REG2 of the memory cell array #1 are "11" as compared with the case #1. Therefore, in a case where the write command is issued to the reference cell of the memory cell array #1, it is controlled not to perform the write to the reference cell of the memory cell array #1 (NOP). On the other hand, in a case where the write command is issued to the reference cell of the memory cell array #2, the reference cell of the memory cell array #1 is used to generate the reference potential, and the reference cell of the memory cell array #2 is read to perform the read modify write (RMW) operation.

In a case #8, REG1 and REG2 of the memory cell array #2 are "01" as compared with the case #7. Therefore, in a case where the write command is issued to the reference cell of the memory cell array #2, the reference cell of the memory cell array #1 is used to generate the reference potential, and the reference cell of the memory cell array #2 is read to perform the read modify write (RMW) operation. On the other hand, in a case where the write command is issued to the reference cell of the memory cell array #1, it is controlled not to perform the write to the reference cell of the memory cell array #1 (NOP) as in the case #7.

In a case #9, REG1 and REG2 of both of them are "11", and this means that the data values in the reference cells of both the memory cell arrays #1 and #2 are in the retention time. Therefore, even in a case where the write command is issued to the reference cell of either the memory cell array #1 or #2, it is controlled not to perform write (NOP).

Note that, although nine states are assumed using two registers of REG1 and REG2, the number of registers is not limited, and a required number of registers may be used as appropriate.

[State Transition]

Figure 11:
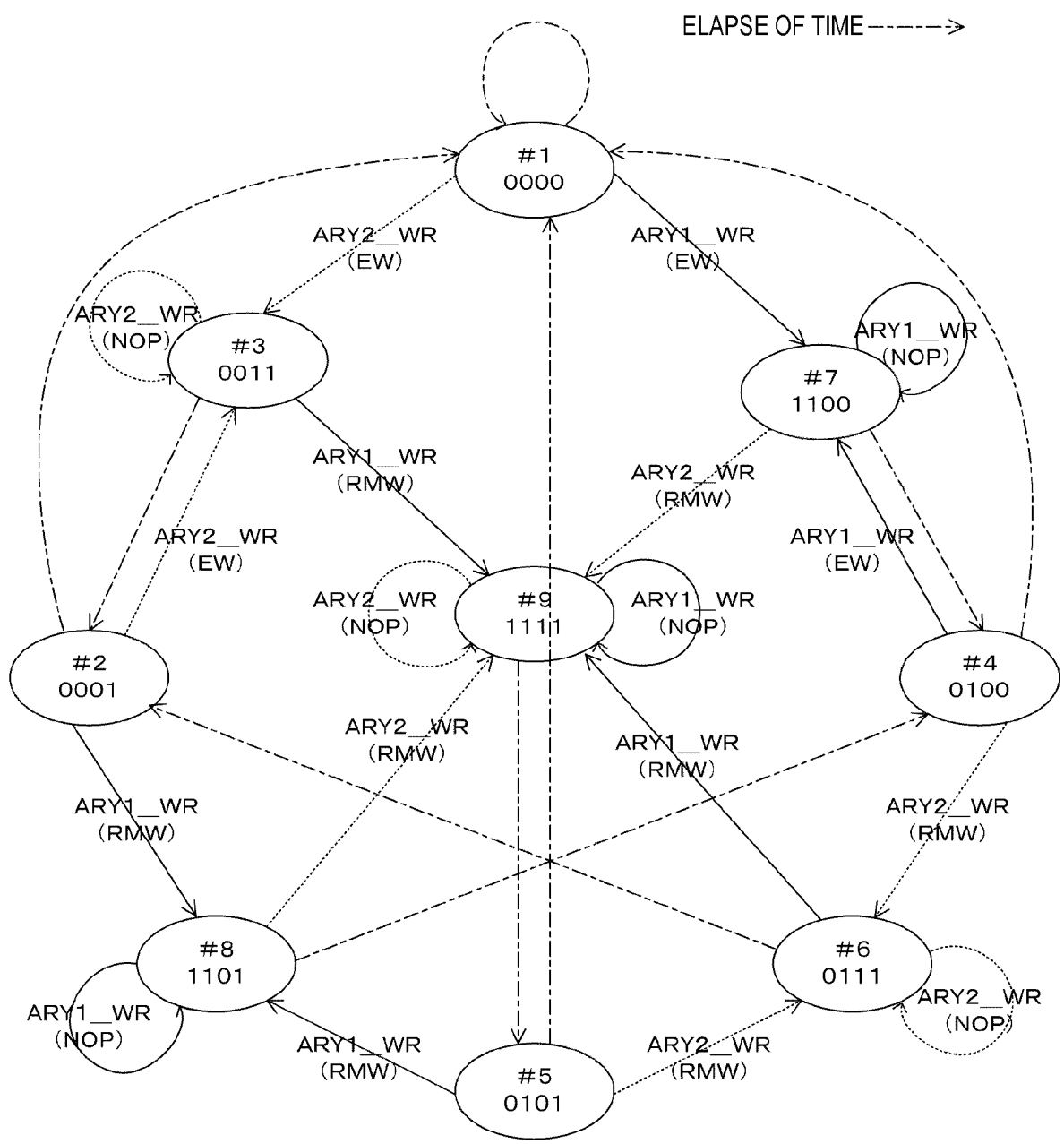
FIG. 11 is a view illustrating an example of state transition of the reference cell write operation control circuit 191 in the embodiment of the present technology.

FIG. 11 is a view illustrating an example of state transition of the reference cell write operation control circuit 191 in the embodiment of the present technology.

In this example, a transition example between the states of the cases #1 to #9 described above is illustrated. Regarding lines between the states, a solid line indicates a case where the write command is issued to the reference cell of the memory cell array #1, and a dotted line indicates a case where the write command is issued to the reference cell of the memory cell array #2. Furthermore, a dashed-dotted line indicates state transition caused by notice from the timer circuit 192 due to an elapse of time.

In a case where the write is performed to the reference cell, corresponding REG1 and REG2 are set to "11". Then, each time the timer circuit 192 gives notice of the elapse of a certain time, it transits from "11" to "01" and from "01" to "00". The write to the reference cell is controlled according to the state changed in this manner.

3. Application Example

Figure 12:
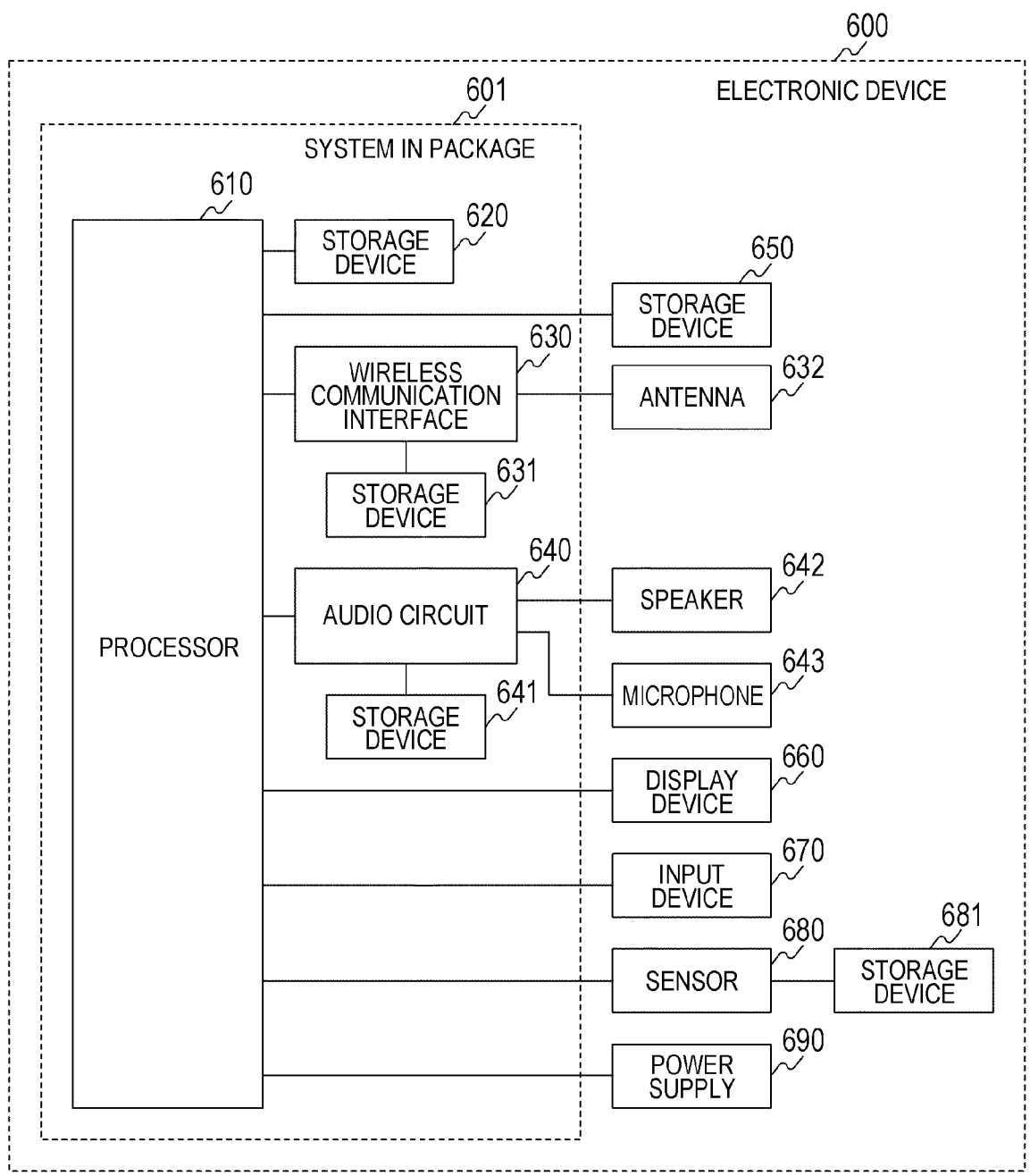
FIG. 12 is a view illustrating a configuration example of an electronic device 600 to which the storage device in the embodiment of the present technology is applied.

FIG. 12 is a view illustrating a configuration example of an electronic device 600 to which the storage device according to the embodiment of the present technology is applied.

The electronic device 600 includes a system-in-package 601, an antenna 632, a speaker 642, a microphone 643, a display device 660, an input device 670, a sensor 680, and a power supply 690. Furthermore, the system-in-package 601 also includes a processor 610, a wireless communication interface 630, and an audio circuit 640.

The antenna 632 is an antenna for performing mobile communication, wireless LAN, or short-range communication, and is connected to the wireless communication interface 630. The speaker 642 outputs sound and is connected to the audio circuit 640. The microphone 643 collects sound around the electronic device 600 and is connected to the audio circuit 640.

The display device 660 is configured by using, for example, a liquid crystal display, an organic EL display, a light emitting diode (LED) indicator and the like, and is connected to the processor 610. The input device 670 is configured by using, for example, a keyboard, a button, a touch panel and the like, and is connected to the processor 610.

The sensor 680 has functions of an optical sensor, a position sensor, an acceleration sensor, a biosensor, a magnetic sensor, a mechanical quantity sensor, a thermal sensor, an electric sensor, a chemical sensor and the like. The storage device according to the embodiment of the present technology may be connected to the sensor 680 as a storage device 681. The power supply 690 supplies power to the electronic device 600, and is, for example, a power supply supplied from a battery, an AC adapter and the like.

The processor 610 is an electronic circuit for controlling an operation of the electronic device 600 to which the storage device according to the embodiment of the present technology may be connected as a storage device 620 inside the system-in-package 601 or a storage device 650 outside the system-in-package 601. In that case, the processor 610 issues a command to perform read or write to the storage device 620 or 650. That is, the processor 610 is an example of a host computer recited in claims.

The wireless communication interface 630 has functions of mobile communication, wireless LAN, or short-range communication. The storage device according to the embodiment of the present technology may be connected to the wireless communication interface 630 as a storage device 631. The audio circuit 640 has a function of controlling the speaker 642 and microphone 643, and the audio circuit 640 may be connected to the storage device according to the embodiment of the present technology as a storage device 641.

As described above, according to the embodiment of the present technology, the state of the certainty of the data of the reference cell is stored in the state storage units 211 and 221, and the write control units 212 and 222 control on the basis of this, so that the state of the reference cell may be appropriately managed. Furthermore, this makes it possible to minimize the number of times of write to the reference cell, reduce power consumption, and relax endurance constraint of the memory cell.

Note that the above-described embodiment describes an example of embodying the present technology, and there is a correspondence relationship between items in the embodiment and the matters specifying the invention in claims. Similarly, there is a correspondence relationship between the matters specifying the invention in claims and the matters in the embodiment of the present technology having the same names. However, the present technology is not limited to the embodiment and may be embodied by variously modifying the embodiment without departing from the scope thereof.

Furthermore, the procedure described in the above-described embodiment may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-ray (trademark) disc and the like may be used, for example, as the recording medium.

Note that the effect described in this specification is illustrative only and is not limitative; there may also be another effect.

Note that, the present technology may also have a following configuration.

(1) A storage control device provided with:
a state storage unit that stores, regarding each of a first reference cell that generates reference potential of a sense amplifier, the first reference cell included in a first memory cell array, and a second reference cell that generates reference potential of the sense amplifier, the second reference cell included in a second memory cell array, a state indicating certainty of a held value; and
a write control unit that controls, when write to either one of the first and second reference cells is instructed, the instructed write on the basis of the state regarding the first and second reference cells stored in the state storage unit.

(2) The storage control device according to (1) described above,
in which the write control unit performs write to first and second reference cell groups including the first and second reference cells, respectively, as a unit, and
the state storage unit stores the state for each of the first and second reference cell groups.

(3) The storage control device according to (1) or (2) described above,
in which, when the write to either one of the first and second reference cells is performed, the state storage unit updates the state regarding the reference cell to which the write is performed.

(4) The storage control device according to any one of (1) to (3) described above,
in which, when the write to either one of the first and second reference cells is performed, the state storage unit updates the state regarding the reference cell according to an elapsed time from the write.

(5) The storage control device according to (4) described above, further provided with:
a timer circuit that manages the elapsed time from the write.

(6) The storage control device according to any one of (1) to (5),
in which, in a case where the state regarding the first reference cell stored in the state storage unit satisfies a predetermined condition when the write to the first reference cell is instructed, the write control unit controls not to perform the write to the first reference cell.

(7) The storage control device according to (6) described above,
in which, in a case where the state regarding the first reference cell stored in the state storage unit does not satisfy the predetermined condition when the write to the first reference cell is instructed, the write control unit controls to perform the write to the first reference cell according to the state regarding the second reference cell stored in the state storage unit.

(8) The storage control device according to (7) described above,
in which, in a case where the state regarding the first reference cell does not satisfy the predetermined condition and in a case where the state regarding the second reference cell satisfies another predetermined condition, the write control unit controls to perform the write to the first reference cell only when a value of the first reference cell read with reference to the reference potential generated from the second reference cell does not coincide with a predetermined read expected value.

(9) The storage control device according to (8) described above, further provided with:
a decision circuit that decides whether the value of the first reference cell read with reference to the reference potential of the sense amplifier generated from the second reference cell coincides with the predetermined read expected value.

(10) The storage control device according to any one of (7) to (9) described above,
in which, in a case where the state regarding the first reference cell does not satisfy the predetermined condition and in a case where the state regarding the second reference cell does not satisfy another predetermined condition, the write control unit controls to perform the write to the first reference cell.

(11) A storage device provided with:
a first memory cell array including a first reference cell that generates reference potential of a sense amplifier;
a second memory cell array including a second reference cell that generates reference potential of the sense amplifier;
a state storage unit that stores, regarding each of the first and second reference cells, a state indicating certainty of a held value; and
a write control unit that controls, when write to either one of the first and second reference cells is instructed, the instructed write on the basis of the state regarding the first and second reference cells stored in the state storage unit.

(12) The storage device according to (11) described above,
in which the first and second reference cells are resistance change memory elements.

(13) The storage device according to (12) described above,
in which the first and second reference cells are magnetic resistance change memory elements.

(14) An information processing system provided with:
a first memory cell array including a first reference cell that generates reference potential of a sense amplifier;
a second memory cell array including a second reference cell that generates reference potential of the sense amplifier;
a host computer that issues commands to perform read or write to the first and second memory cell arrays;
a state storage unit that stores, regarding each of the first and second reference cells, a state indicating certainty of a held value; and
a write control unit that controls, when write to either one of the first and second reference cells is instructed, the instructed write on the basis of the state regarding the first and second reference cells stored in the state storage unit.

REFERENCE SIGNS LIST

10 Magnetic tunnel junction (MTJ) element
11 Free layer
12 Insulating layer
13 Reference layer
20 MOS transistor
110 Memory cell array
111 Memory cell
121 Row decoder
122 Word line driver
130 Reference potential generation circuit
141, 142 Switch
150 Data selection circuit
160 Write driver
170 Sense amplifier
180 Decision circuit
190 Control circuit
191 Reference cell write operation control circuit
192 Timer circuit
193 Reference cell master data holding unit
211, 221 State storage unit
212, 222 Write control unit
610 Processor
620, 650 Storage device

The invention claimed is:

1. A storage control device comprising:
a state storage unit that stores, regarding each of a first reference cell that generates reference potential of a sense amplifier, the first reference cell included in a first memory cell array, and a second reference cell that generates reference potential of the sense amplifier, the second reference cell included in a second memory cell array, a state indicating certainty of a held value; and
a write control unit that controls, when write to either one of the first and second reference cells is instructed, the instructed write on a basis of the state regarding the first and second reference cells stored in the state storage unit.

2. The storage control device according to claim 1,
wherein the write control unit performs write to first and second reference cell groups including the first and second reference cells, respectively, as a unit, and
the state storage unit stores the state for each of the first and second reference cell groups.

3. The storage control device according to claim 1,
wherein, when the write to either one of the first and second reference cells is performed, the state storage unit updates the state regarding the reference cell to which the write is performed.

4. The storage control device according to claim 1,
wherein, when the write to either one of the first and second reference cells is performed, the state storage unit updates the state regarding the reference cell according to an elapsed time from the write.

5. The storage control device according to claim 4, further comprising:
a timer circuit that manages the elapsed time from the write.

6. The storage control device according to claim 1,
wherein, in a case where the state regarding the first reference cell stored in the state storage unit satisfies a predetermined condition when the write to the first reference cell is instructed, the write control unit controls not to perform the write to the first reference cell.

7. The storage control device according to claim 6,
wherein, in a case where the state regarding the first reference cell stored in the state storage unit does not satisfy the predetermined condition when the write to the first reference cell is instructed, the write control unit controls to perform the write to the first reference cell according to the state regarding the second reference cell stored in the state storage unit.

8. The storage control device according to claim 7,
wherein, in a case where the state regarding the first reference cell does not satisfy the predetermined condition and in a case where the state regarding the second reference cell satisfies another predetermined condition, the write control unit controls to perform the write to the first reference cell only when a value of the first reference cell read with reference to the reference potential generated from the second reference cell does not coincide with a predetermined read expected value.

9. The storage control device according to claim 8, further comprising:
a decision circuit that decides whether the value of the first reference cell read with reference to the reference potential of the sense amplifier generated from the second reference cell coincides with the predetermined read expected value.

10. The storage control device according to claim 7,
wherein, in a case where the state regarding the first reference cell does not satisfy the predetermined condition and in a case where the state regarding the second reference cell does not satisfy another predetermined condition, the write control unit controls to perform the write to the first reference cell.

11. A storage device comprising:
a first memory cell array including a first reference cell that generates reference potential of a sense amplifier;
a second memory cell array including a second reference cell that generates reference potential of the sense amplifier;
a state storage unit that stores, regarding each of the first and second reference cells, a state indicating certainty of a held value; and
a write control unit that controls, when write to either one of the first and second reference cells is instructed, the instructed write on a basis of the state regarding the first and second reference cells stored in the state storage unit.

12. The storage device according to claim 11,
wherein the first and second reference cells are resistance change memory elements.

13. The storage device according to claim 12,
wherein the first and second reference cells are magnetic resistance change memory elements.

14. An information processing system comprising:
a first memory cell array including a first reference cell that generates reference potential of a sense amplifier;
a second memory cell array including a second reference cell that generates reference potential of the sense amplifier;
a host computer that issues commands to perform read or write to the first and second memory cell arrays;
a state storage unit that stores, regarding each of the first and second reference cells, a state indicating certainty of a held value; and
a write control unit that controls, when write to either one of the first and second reference cells is instructed, the instructed write on a basis of the state regarding the first and second reference cells stored in the state storage unit.

* * * * *